(12) United States Patent
Kato

(10) Patent No.: US 6,190,196 B1
(45) Date of Patent: Feb. 20, 2001

(54) CABLE CONNECTOR ASSEMBLY

(75) Inventor: Yasuhiro Kato, Tokyo (JP)

(73) Assignee: The Whitaker Corporation, Wilmington, DE (US)

( * ) Notice: Under 35 U.S.C. 154(b), the term of this patent shall be extended for 0 days.

(21) Appl. No.: 08/936,286

(22) Filed: Sep. 24, 1997

(30) Foreign Application Priority Data

Sep. 27, 1996 (JP) .................................................. 8-277404

(51) Int. Cl.[7] .......................... H01R 12/24; H01R 12/00; H05K 1/00
(52) U.S. Cl. .......................................... 439/493; 439/76.1
(58) Field of Search ........................... 439/493, 77, 76.1, 439/497

(56) References Cited

U.S. PATENT DOCUMENTS

| 3,701,964 | * | 10/1972 | Cronin .................................... 439/45 |
| 4,108,527 |   | 8/1978  | Douty et al. ........................... 439/465 |
| 4,147,399 |   | 4/1979  | Moser et al. ........................... 439/398 |
| 4,602,830 |   | 7/1986  | Lockard ................................. 439/108 |
| 4,602,831 |   | 7/1986  | Lockard ................................. 439/108 |
| 4,655,515 |   | 4/1987  | Hamsher, Jr. et al. .............. 439/108 |
| 4,679,868 |   | 7/1987  | Hasircoglu ............................ 439/495 |
| 4,682,828 |   | 7/1987  | Piper et al. ............................. 439/92 |
| 4,722,580 |   | 2/1988  | Kocher et al. ........................ 439/466 |
| 4,871,319 |   | 10/1989 | Babow .................................... 439/77 |
| 4,892,489 | * | 1/1990  | Hirai ...................................... 439/497 |
| 4,902,242 |   | 2/1990  | Davis et al. ........................... 439/404 |
| 5,190,473 |   | 3/1993  | Mroczkowski et al. ............. 439/580 |
| 5,556,300 | * | 9/1996  | Parker ................................... 439/497 |
| 5,855,493 |   | 1/1999  | Shelly .................................... 439/465 |

FOREIGN PATENT DOCUMENTS

| 63-266549 | 4/1990 | (JP) . |
| 63-270216 | 4/1990 | (JP) . |
| 63-334994 | 6/1990 | (JP) . |

* cited by examiner

*Primary Examiner*—Brian Sircus
*Assistant Examiner*—Chandrika Prasad

(57) ABSTRACT

A cable connector assembly and a method of fabrication thereof provides for easy and accurate electrical connection of flat cables having narrow pitch. Multiple conductors of a flat cable (15) are exposed by stripping near the end of the flat cable (15) to expose portions (18) of the conductors after which the flat cable (15) is placed nearly parallel against the surface of the printed circuit board (90) and the exposed portions (18) are soldered to conductive pads (93) on the printed circuit board (90). To other parts of the printed circuit (90), contacts (25,26) having contact sections (30) for the contacts of a matching connector are connected. This makes it possible to provide for the connection of all conductors of the flat cable (15) to appropriate circuits of the printed circuit board (90) to which contacts (25,26) are connected.

9 Claims, 9 Drawing Sheets

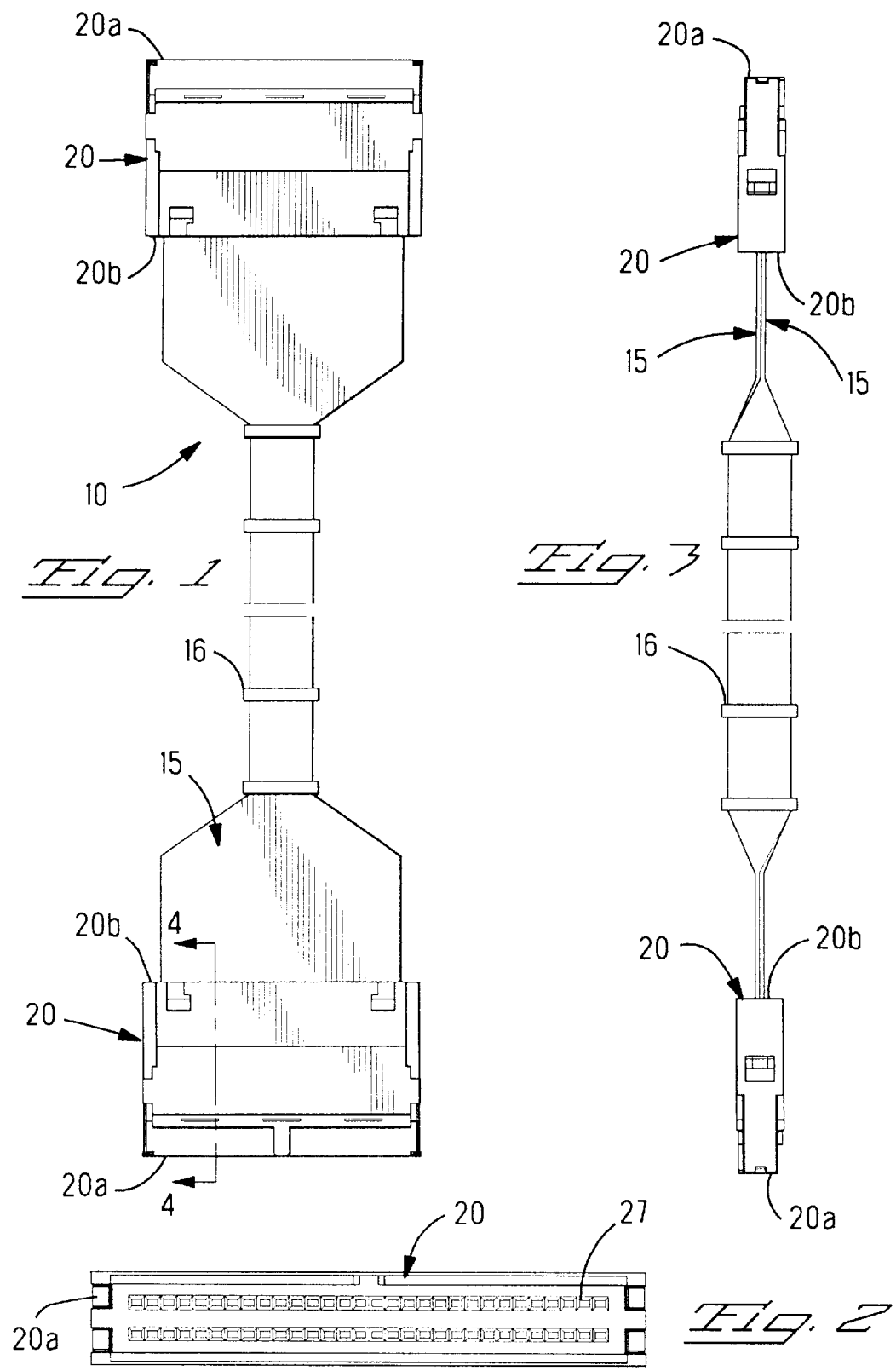

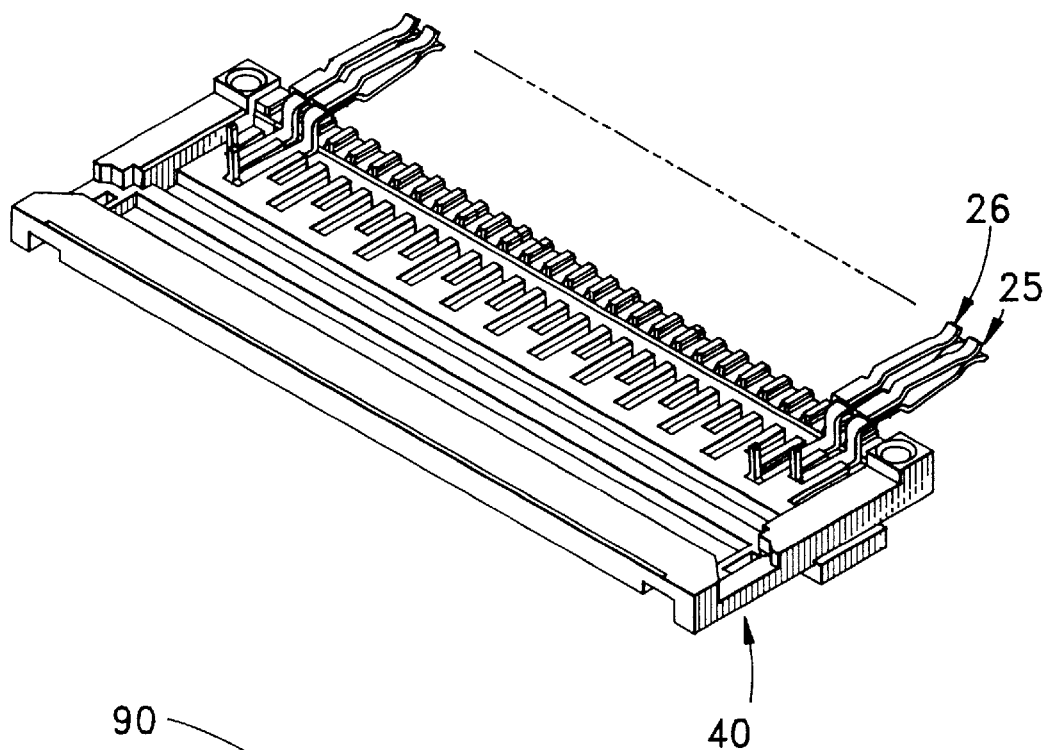
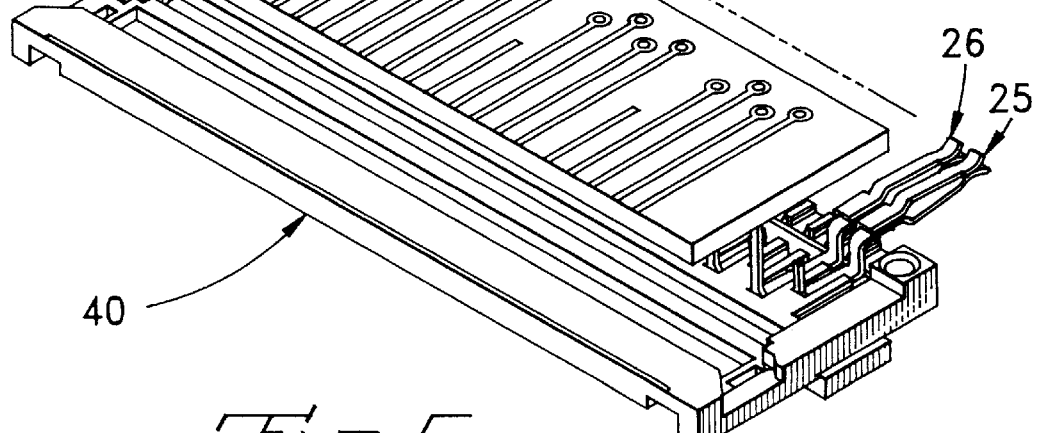

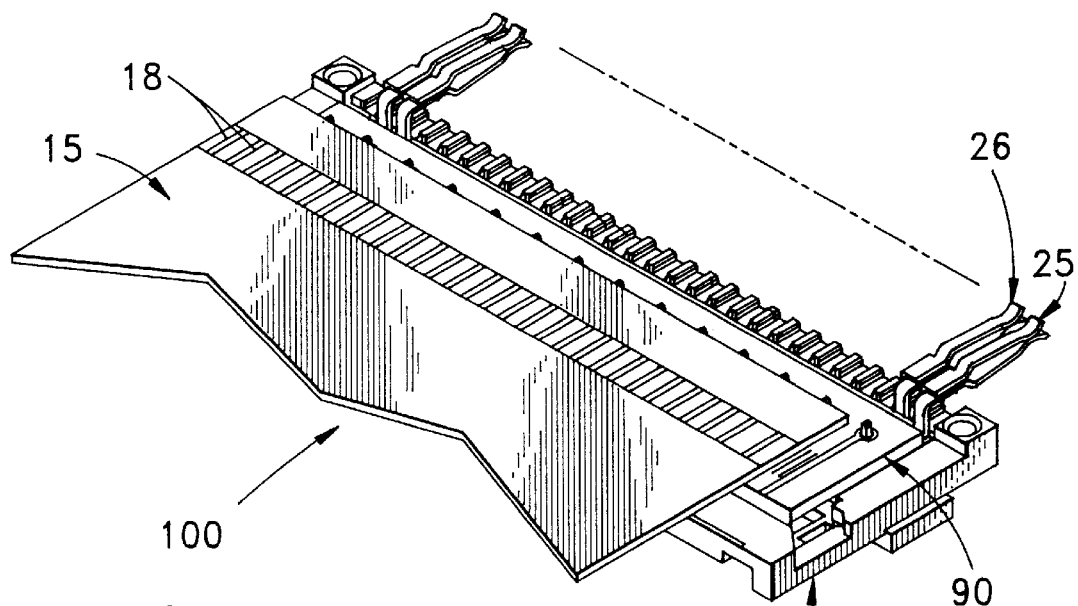
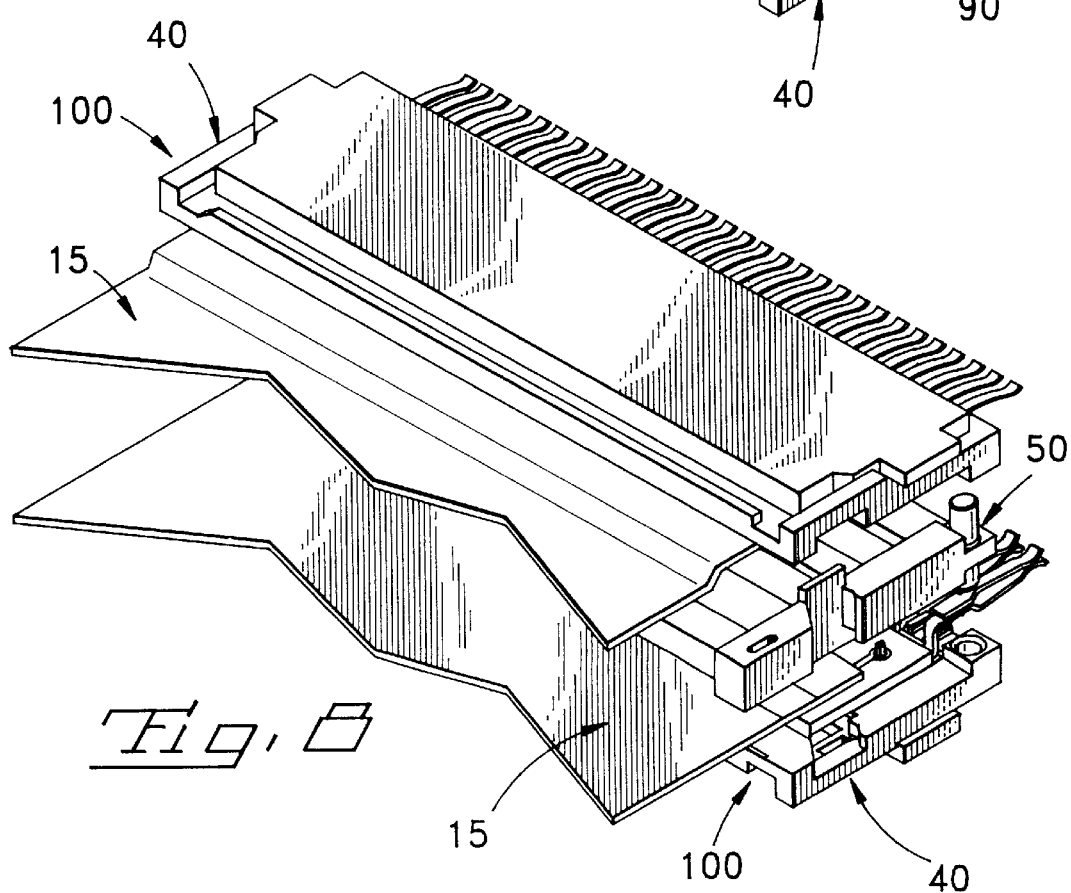

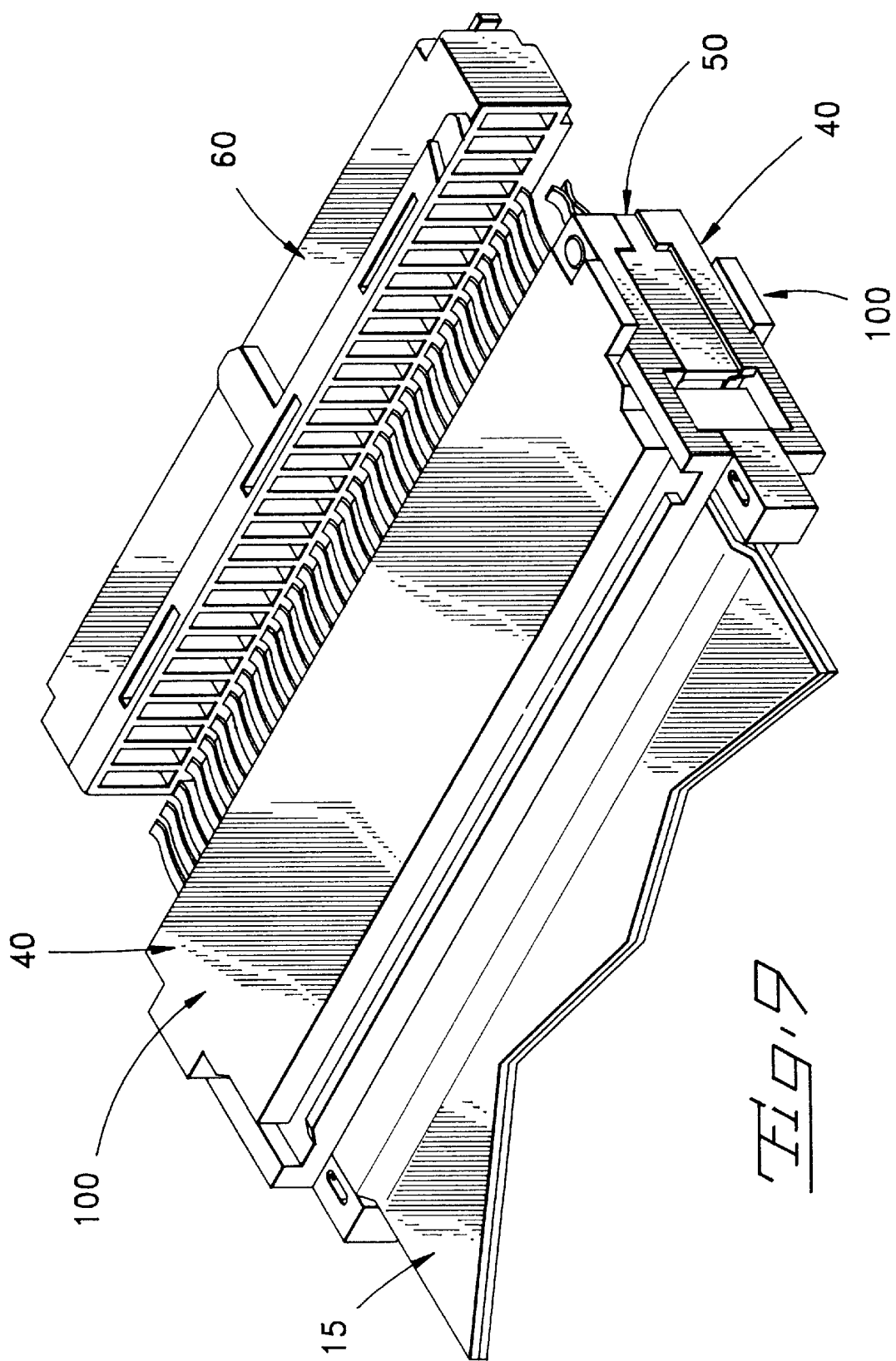

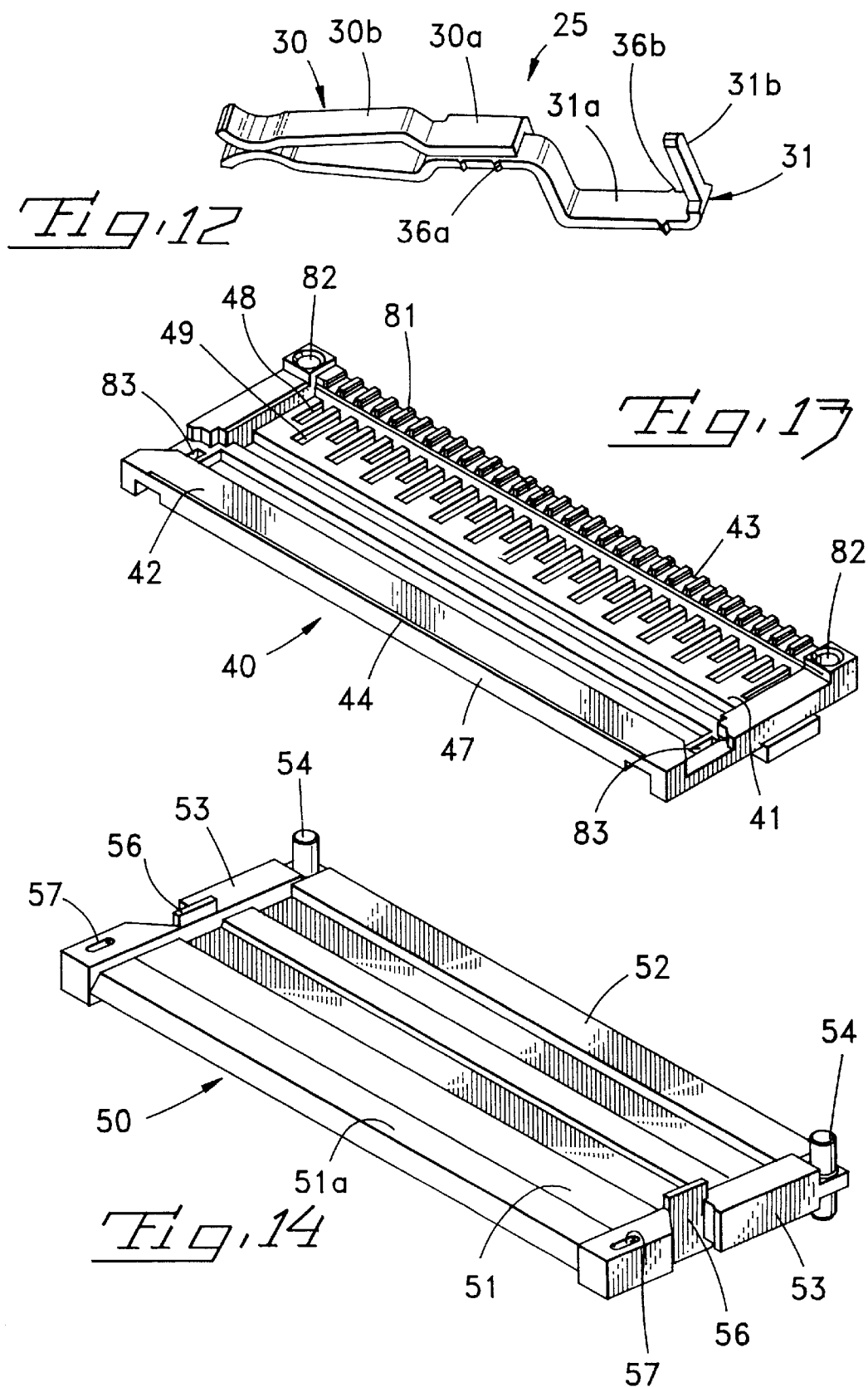

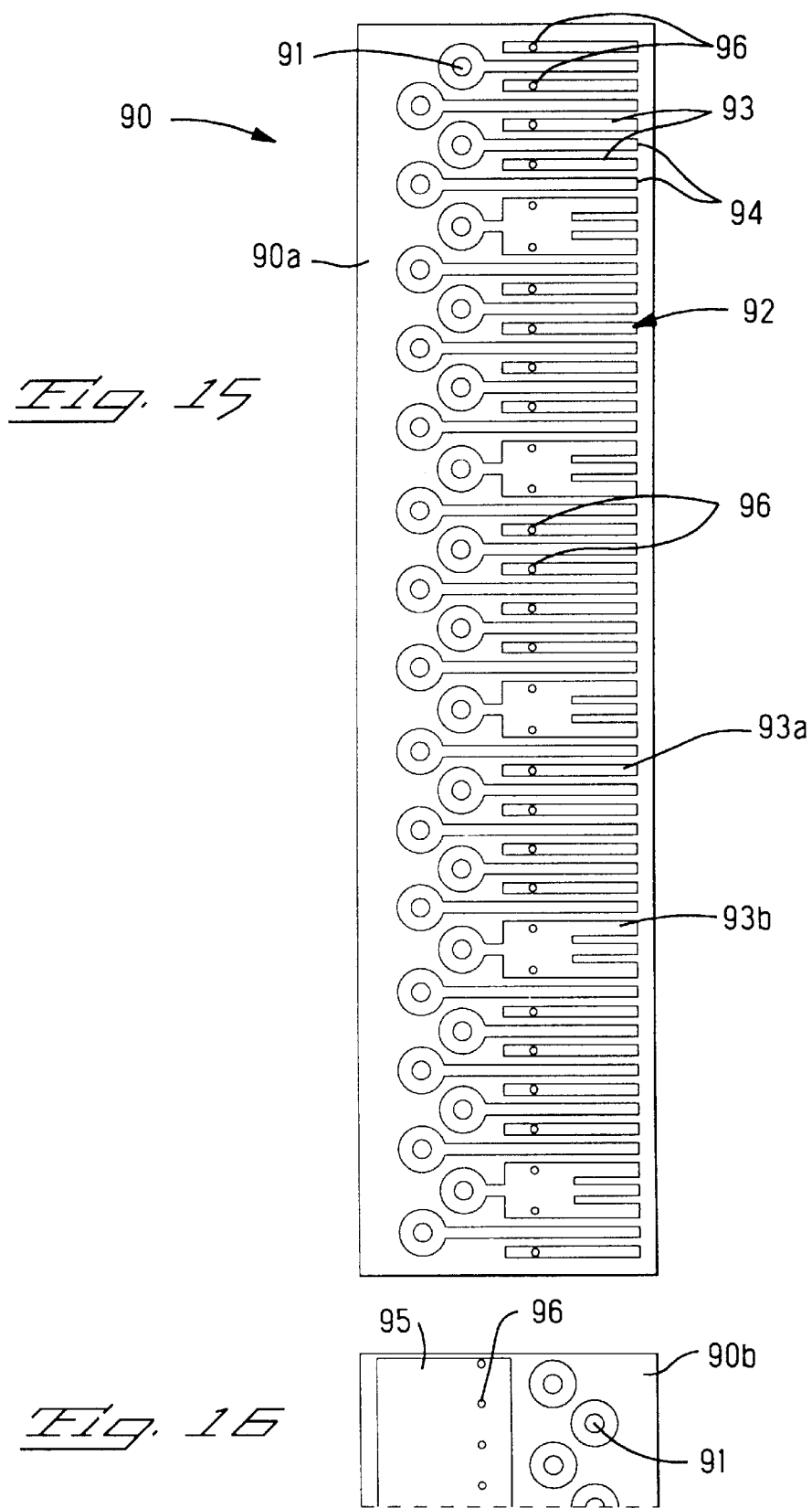

CABLE CONNECTOR ASSEMBLY

FIELD OF THE INVENTION

This invention relates to cable connector assemblies connected to flat cables and to a method of the fabrication of such assemblies.

BACKGROUND OF THE INVENTION

Cable connector assemblies are known, such as, for example, cable connector assemblies described in Japanese Patent Laid-Open Nos. 114475/90, 117074/90 and 181373/90. In such cable connector assemblies, a flat cable having both signal conductors and ground conductors is connected to a connector so that the signal conductors of the flat cable are connected to signal contacts and the ground conductors are connected to the ground bus bar or the ground contact by compression.

Due to recent trends toward miniaturization of connectors and reduction of the pitch of conductors in flat cables, it is also desirable to reduce the size of the cable connector assemblies mentioned above. However, in the cable connector assemblies described in the above patent publications, all conductors are connected to signal contacts, ground terminal or bus bar by compression or insulation displacement that makes them unsuitable for miniaturization and small-pitch cables. Therefore, the goal of this invention is to provide a cable connector assembly that is suitable for miniaturization and easy to assemble, and a method of fabrication of such an assembly.

SUMMARY OF THE PRESENT INVENTION

This invention relates to a flat cable connector assembly that is used to electrically connect a flat cable having multiple conductors to multiple contacts arranged in an insulating housing by exposing conductors of the flat cable in a widthwise direction at a location distal from a cable end, placing the flat cable nearly parallel and on the surface of a printed circuit board, by connecting the exposed conductor portions to conductive pads on the printed circuit board and by connecting the printed circuit board to multiple electrical contacts arranged in the insulating housing.

It is preferable that the circuitry is provided on one side of the printed circuit board, while a commoning ground plane is located on the other side, and that the solder connections of the multiple contacts and the flat cable conductors are located on the one side of the circuit board. In such a case, a part of the conductors of the flat cable and the contacts will be connected to the ground conductors.

In addition, a pair of prepared printed circuit boards with flat cables connected to them can be arranged against each other and multiple contacts corresponding to the flat cable can be located in a mutually opposed pattern in the insulating housing.

Moreover, this invention relates to a method of fabrication of a cable connector assembly in that it comprises the steps of exposing portions of multiple conductors of a flat cable at a location distal from a cable end by stripping a portion of the insulating coating, connecting to a printed circuit board multiple electrical contacts having contact sections for the connection to mating contacts along a mating face, and board-connection sections for the connection to the printed circuit board, placing the flat cable on the printed circuit board nearly parallel to the surface of the circuit board and connecting the exposed portions of the multiple conductors to the printed circuit board, and arranging the contact sections of the multiple contacts in an insulating housing.

It is desirable that the step of connecting the multiple contacts to the printed circuit board comprise a step of securing the multiple contacts to a supporting structure so that connecting sections of the contacts intended for connection to the printed circuit board are positioned for connection to the printed circuit board.

It is desirable that the step of connecting the exposed portions of the conductors to the printed circuit board comprise a step of forming the exposed portions and another step of soldering the formed exposed portions to the printed circuit board.

It is desirable that the step of arranging the contact sections inside the insulating housing comprise placing a central insulating divider between two printed circuit boards connected to two different flat cables, arranging the printed circuit boards on top and bottom surfaces of the central insulating divider and arranging the multiple contacts connected to the printed circuit boards in an inversely symmetrical pattern, and placing the contact sections inside the insulating housing.

BRIEF DESCRIPTION OF THE DRAWINGS

An embodiment of the invention and a method of fabrication thereof will now be described with reference to the accompanying drawings, in which:

FIGS. 1 to 3 are top plan, side and front views showing a cable connector assembly of the present invention.

FIG. 5 is an isometric view showing a support on which electrical contacts are mounted and for a printed circuit board to be mounted thereon.

FIG. 6 is a view similar to FIG. 5 showing a printed circuit board in position to be electrically connected to the electrical contacts.

FIG. 7 is a view similar to FIG. 6 showing the printed circuit board mounted on the support and electrically connected to the electrical contacts and a flat cable in position to be electrically connected to the printed circuit board thereby forming a connector subassembly.

FIG. 8 is an exploded isometric view of connector subassemblies and an insulating divider disposed therebetween.

FIG. 9 is a view similar to FIG. 8 showing the connector subassemblies and insulating divider assembled together and an insulating housing exploded therefrom.

FIG. 12 is an oblique view of an electrical contact for use in the cable connector assembly.

FIG. 13 is an isometric view of a support for the electrical contacts and the printed circuit board.

FIG. 14 is an isometric view of an insulating divider.

FIG. 15 is a top plan view of an upper side of the printed circuit board to which electrical contacts and exposed portions of a flat cable are to be electrically connected.

FIG. 16 is a part bottom view of the printed circuit board shown in FIG. 15.

DETAILED DESCRIPTION OF THE INVENTION

Figure 4:
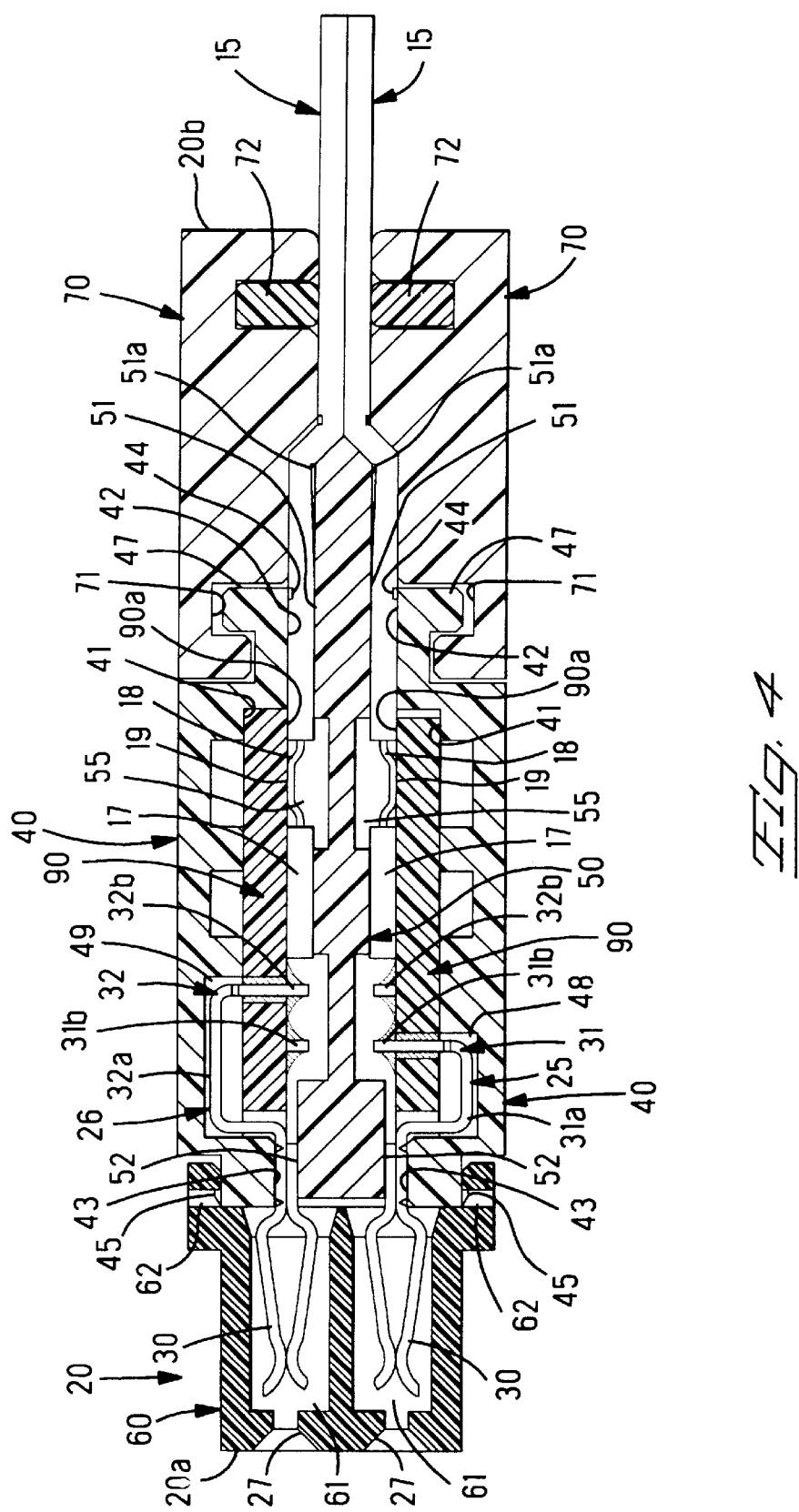
FIG. 4 is a cross-sectional view taken along line 4—4 of FIG. 1.

Cable connector assembly 10 depicted in FIGS. 1–3 comprises connectors 20 and flat cables 15. Connectors 20 located at the ends of the cables 15 are of the same construction. Connectors 20 have their mating faces 20a facing in opposite directions, and their opposite or cable faces 20b are configured as a continuation of the flat cables 15 extending from the center. In the mating faces 20a of the connectors 20, openings 27 are made that are connected to the cavities accommodating electrical contacts to be described below. Middle portions of flat cables 15 are tied by tapes 16 to form a tubular shape.

Connector 20 shown in FIG. 4 comprises printed circuit boards 90 connected to flat cables 15 and electrical contacts 25,26 (FIG. 12) connected to respective printed circuit boards 90. Contacts 25,26 are arranged in an alternating pattern in two rows. Contacts 25,26 have receptacle-type contact sections 30 of the same configuration and board-connection sections 31,32 having different shapes. Multiple conductors of flat cables 15 have exposed sections 18 where the insulating coating 17 formed around the conductors has been stripped at a location near the end of the cables. The exposed sections 18 are provided for electrical connection to respective printed circuits on circuit boards 90. As shown in FIG. 4, soldering tie-in sections 31,32 and exposed sections 18 are soldered to inner surfaces 90a of the printed circuit boards 90. Printed circuit boards 90 are located in cavities 41 of supports 40 (FIGS. 5 and 13) and inner surfaces 90a thereof are separated from each other by means of insulating divider 50 (FIGS. 8 and 14). Printed circuit boards 90 are arranged in such a way that surfaces 90a are located at the same level as horizontal surfaces 42 of the supports 40. Surfaces 90a, horizontal surfaces 42 and surfaces 51 of the insulating divider 50 form reception cavities 55 for the flat cables 15. At the rear ends of the horizontal surfaces 42, ribs 44 are located whose purpose is to retain the flat cables 15 between the horizontal surfaces 42 and surfaces 51 of the insulating divider 50. Passages are provided for contacts 25,26 at the front ends 43 of the supports 40 and surfaces 52 of the insulating divider 50.

At mating face 20a of connector 20, insulating housing 60 is secured that has multiple cavities 61 accommodating receptacle-type contact sections 30 of the contacts 25,26. In the insulating housing 60, slots 62 are provided into which lugs 45 formed on the supports 40 are engaged. At the rear end of the supports 40, cover housings 70 are mounted. Cover housings 70 (FIGS. 10 and 18) have grooves 71 fitting over ribs 47 provided on the supports 40. The engagement of grooves 71 over ribs 47 provides for the accurate assembly of all components. After that, the supports 40 and the cover housings 70 are secured together by means of a pair of metal locks 80 (FIGS. 11 and 18) that fit over respective sides of the connector 20. Explanations regarding the lock 80 are set forth below. The cover housings 70 extend beyond the insulating divider 50, and the rear portions of the cover housings 70 (that is the cable face 20b of the connector 20) hold flat cables 15 together. Inside the cover housings 70, retaining members 72 are placed that retain flat cables 15. Cover housings 70, together with the retaining members 72 clamp against and sandwich flat cables 15 from the top and the bottom, thus providing a means of stress relief for the flat cables 15.

Next, an explanation describing the method of fabrication of the cable connector assembly 10 using FIGS. 5–11 for reference is set forth below.

The first step of the assembly process involves the preparation of the flat cable 15. This preparation of the flat cable 15 is not shown in the drawings, but it involves measuring and cutting the flat cable to the required length, exposing a portion of the conductors by stripping the insulating coating inwardly from both ends of the flat cable 15, and then forming portions of the flat cable 15. During the stripping of the flat cable 15, the insulating coating of the flat cable 15 is cut by a cutter near the end of the cable and slightly moved towards the end so that insulating coating remains at the end of the cable (see FIGS. 4 and 7). In addition, during the forming of the flat cable 15, the exposed portions 18 are bent as shown in FIG. 4 to form a connecting surface 19 to be attached to the respective printed circuits on printed circuit board 90.

During the second step of the assembly process, contacts 25,26 are assembled in the support 40 as shown in FIG. 5. FIG. 12 shows a perspective view of the contact 25. The soldering tie-in section 31 of the contact 25 has a relatively wide horizontal portion 31a and a relatively narrow vertical portion or post 31b intended for the soldering extending from the horizontal portion 31a. As can be seen from FIG. 4, the board-connecting section 32 of the contact 26 also has a horizontal portion 32a and a vertical post 32b, but it is different from the board-connecting section 31 in that its horizontal portion 32a is longer than the horizontal portion 31a. The receptacle-type contact section 30 includes a base section 30a and spring contact arms 30b. As it can be seen from FIG. 12, the base section 30a of the receptacle-type contact section 30 of the contact 25 and the horizontal portion 31a have barbs 36a and 36b. The contact 26 also has similar barbs at the same locations (not shown).

FIG. 13 is a perspective view of the support 40 as seen from the rear. In the support 40, longitudinal grooves 48,49 are formed (see FIG. 4) for the insertion of horizontal portions 31a, 32a of the contacts 25,26. In the front end 43 of the support 40, multiple cavities 81 are formed to provide for the sidewise fixation of the contacts 25,26. When contacts 25,26 are mounted in the support 40, the barbs 36a are pressed into the longitudinal grooves 48,49, and barbs 36b are pressed in cavities 81, thus securing contacts 25,26 in the support 40.

The third step of the assembly process (illustrated in FIG. 6) covers the mounting of the printed circuit board 90 to the support 40 and in the soldering of contacts 25,26 thereto. The printed circuit board 90 is shown in FIGS. 15 and 16. As can be seen from FIG. 15, the printed circuit board 90 has multiple through holes 91 that are metal plated inside, a row 92 of circuit conductive pads are formed on the surface 90a, and a ground plane 95 is formed on the other side 90b. Circuit pad row 92 includes first pads 93 and second pads 94. The first pads 93 and the second pads 94 alternate in the pad row 92. All first pads 93 have small diameter through holes 96 for the purpose of connecting them to the ground surface 95. The first pads 93 have pads 93a connected to only the ground plane 95, and pads 93b are connected to adjacent pads by connecting pads formed on the surface 90a. Therefore, the first pads 93 connected to pads 93b constitute a ground circuit, while second pads 94 constitute signal circuits. All second pads 93b, 94 are connected to the through holes 91 of relatively large diameter located away from the circuit pad row 92 by means of circuit pads applied to the surface 90a. All pads having through holes 96 are part of the ground circuit. When the printed circuit board 90 is inserted in the support 40, the opposite side surface 90b including the ground plane 95 is inserted in the cavity 41 formed in the support 40 so that the opposite side surface 90b faces the support 40. Soldering connecting sections 31b, 32b of the contacts 25,26 are then passed through the through holes 91, after which the soldering connecting sections 31b, 32b are soldered to the through holes 91.

The fourth step of the assembly process comprises soldering of flat cables 15 to printed circuit boards 90 as shown in FIG. 7. Exposed portions 18 of flat cable 15, that were stripped during the first step of the assembly process, are placed against circuit pad row 92 formed on the surface of the printed circuit board 90, and the exposed portions 18 of multiple conductors are soldered to corresponding pads. During this process, one signal conductor is soldered to each second pad 94, and two adjacent ground conductors are soldered to each first pad 93. However, only ground conductors are soldered to the pads 93 located at the ends of row 92.

This operation completes the fabrication of a connector subassembly 100.

The fifth step of the assembly process comprises the assembly of two connector subassemblies 100 and the insulating divider 50 as shown in FIG. 8. FIG. 14 is an oblique view of the insulating divider 50 as seen from the back. The insulating divider 50 has at its both sides relatively thick side bars 53; each of the side bars 53 has near their front ends two posts 54. In the middle of both side bars 53, projections 56 are disposed. Posts 54 and projections 56 fit in holes 82 and slots 83 provided in the supports 40 (see FIG. 13) that determine relative positioning of two subassemblies 100 and the insulating divider 50. As can be seen from FIGS. 4 and 8, the insulating divider 50 extends back farther than supports 40. In the rear extensions of the side bars 53, slots 57 are provided. From FIGS. 4 and 14, it can be seen that the back extension of the surface 51 of the insulating divider has a flare section 51a whose purpose is to provide a more reliable retention of the flat cable 15.

Figure 17:
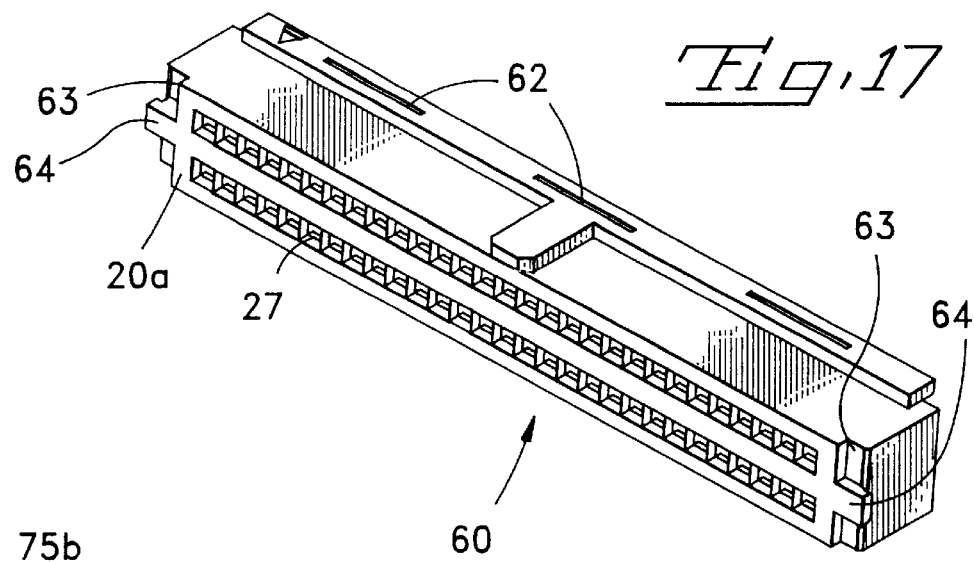
FIGS. 17 and 18 are isometric views of the insulating housing and the cover housing.

The sixth step of the assembly process comprises mounting of the insulating housing 60 to the front end as shown in FIG. 9. FIG. 17 is a perspective view of the insulating housing 60 alone shown from the side of the connector connecting surface 20a, that is, from the front. As can be seen from FIG. 17, the insulating housing 60 has openings 27 arranged in two rows that are connected to multiple cavities 61 (see FIG. 4) accommodating the contact sections 30 of contacts 25,26. As can be seen from FIG. 4, when the insulating housing 60 is mounted onto a respective support 40, receptacle contact sections 30 of the contacts 25,26 are located inside the cavities 61. At both ends of the connecting surface 20a of the insulating housing 60, a pair of latches 64 with shoulders 63 above and below them are formed. In addition, slots 62 having narrow elongated form are made in the housing. As illustrated in FIG. 4, the insulating housing 60 is mounted on support 40 by lugs 45 of the support 40 being disposed in the slots 62 of the insulating housing 60.

Figure 10:
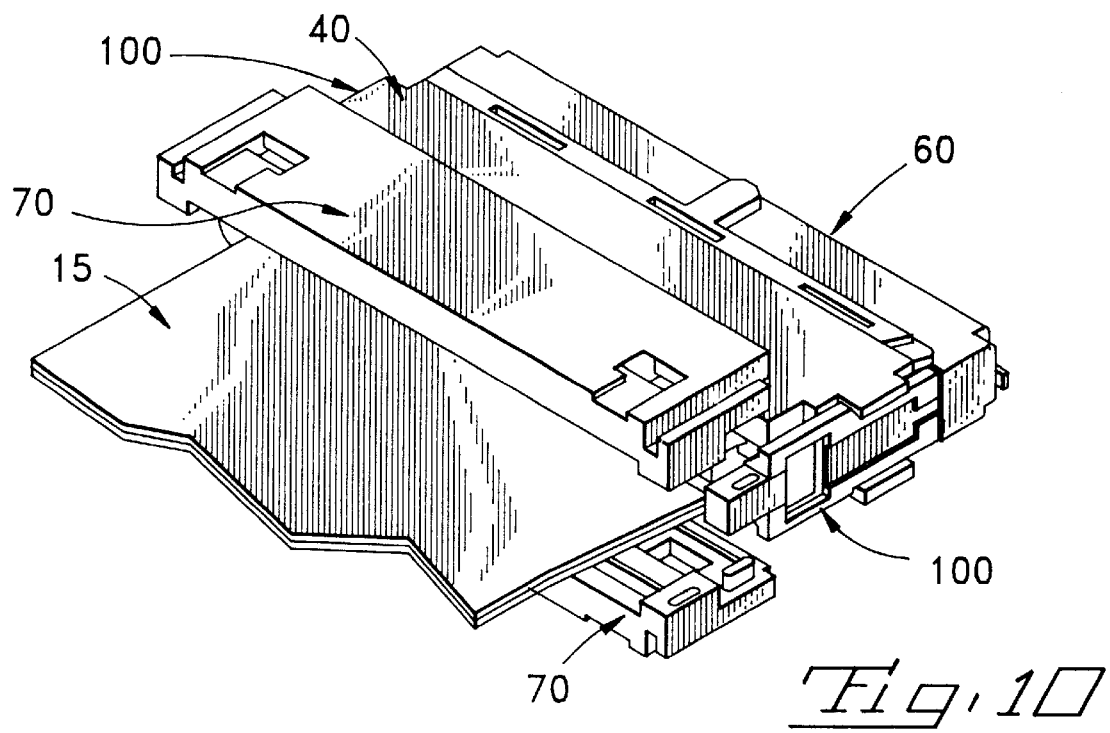
FIG. 10 is a view similar to FIG. 9 showing the connector subassemblies, insulating divider and insulating housing assembled together and cover housings in position to be mounted on the assembled members.
Figure 18:
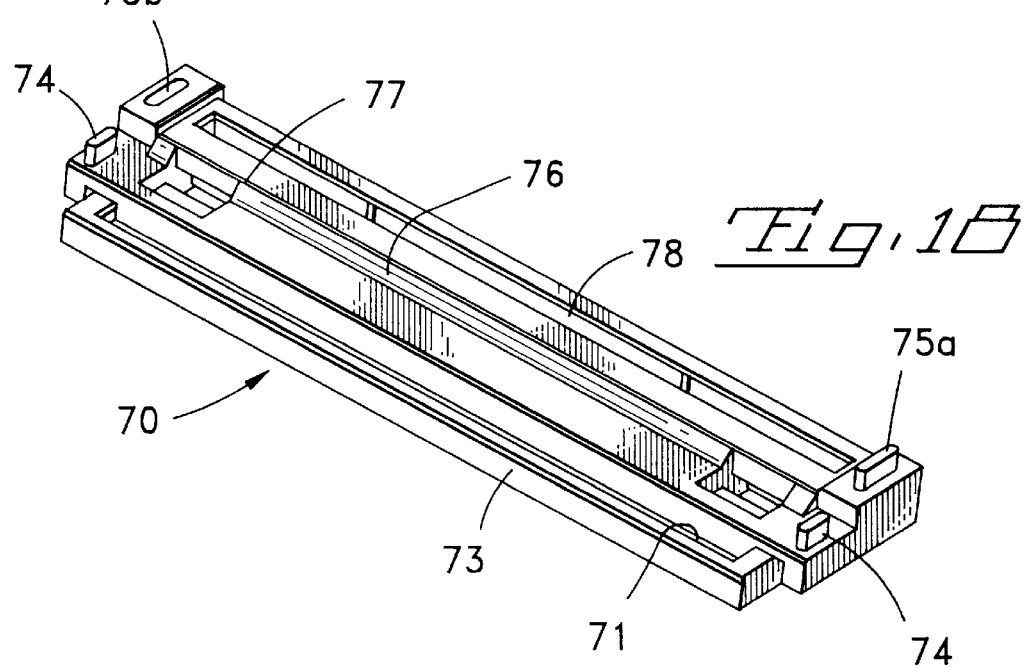

The seventh step of the assembly process comprises mounting of cover housings 70 as shown in FIG. 10. FIG. 18 is a perspective view of the cover housing 70 as seen from the front. The cover housing 70 in its front portion has a tongue 73 with a groove 71 formed in it. At both ends of the housing, lugs 74 are provided and a latching means is located closer to the back end of the housing. The latching means comprise a lug 75a located at one side and a slot 75b located at the other side. In the center of the cover housing 70, a step 77 including a slanted surface 76 is formed. Behind the step, a slot 78 is located that can accommodate retaining member 72.

A pair of cover housings 70 containing retaining members 72 (see FIG. 4) are arranged behind supports 40 over flat cables 15 as shown in FIG. 10. At that time, the ribs 47 of the supports 40 become engaged with the groove 71 of the tongue 73, and the pair of the lugs 74 become engaged with the slots 83 of the supports 40, and the latching means 75a, 75b of the cover housings 70 become engaged with their respective counterparts 75b, 75a.

Figure 11:
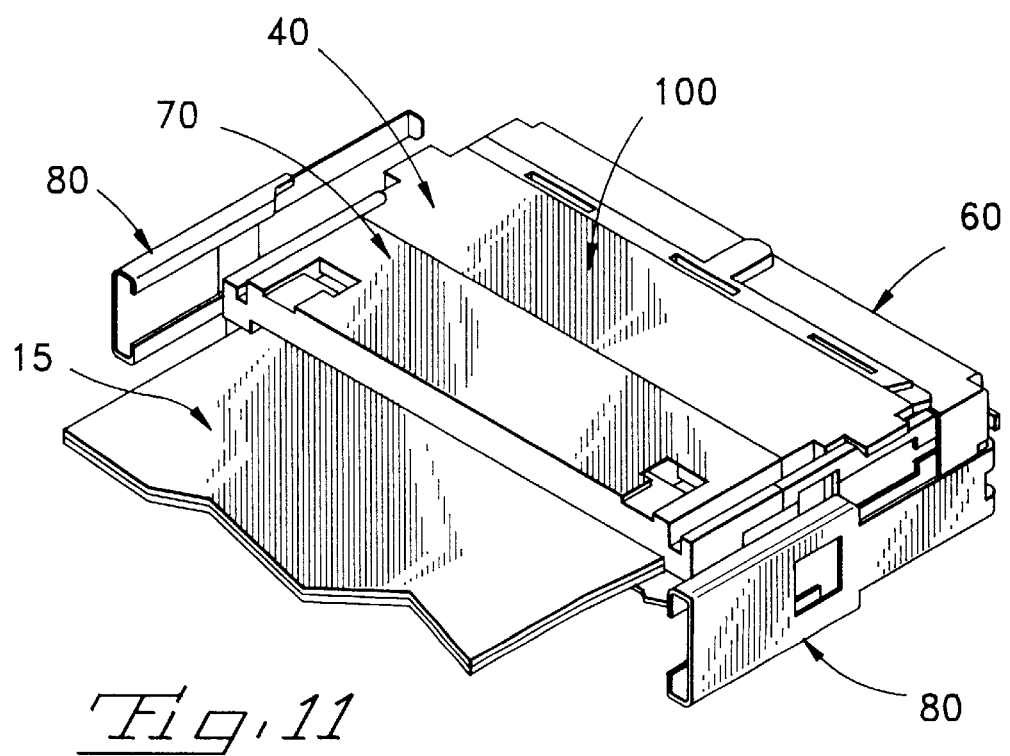
FIG. 11 is a view similar to FIG. 10 showing an assembled cable connector assembly with locks in position to be positioned thereon.
Figure 19:
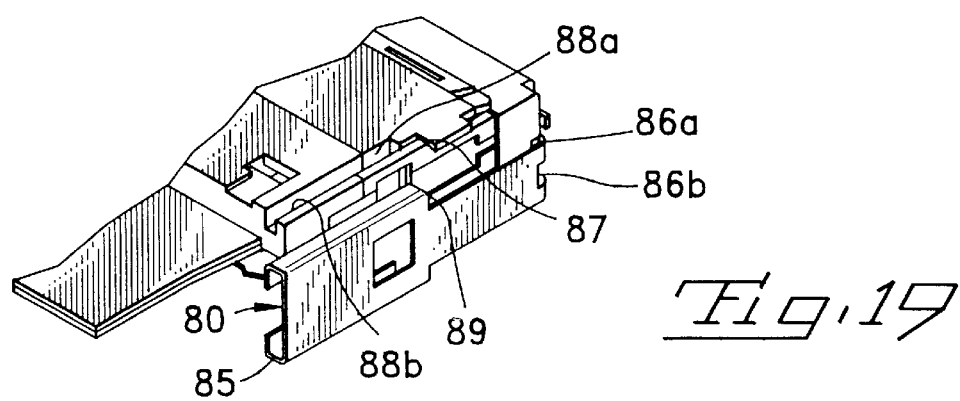
FIG. 19 is a part perspective view similar to FIG. 11 showing details of the cable connector assembly and the locks.

The eighth step of the assembly process comprises mounting of locks 80 over supports 40 thereby locking together subassemblies 100, the cover housings 70 and the insulating housing 60 as shown in FIG. 11. FIG. 19 shows a part perspective view of FIG. 11. As can be seen from FIG. 11 and FIG. 19, the lock 80 is made of sheet metal bent into a configuration having a C-shaped cross section. The lock 80 includes a slip-on section 85 and a pair of catches 86a formed in the front. The slip-on section 85 has opposed channels that fit over rails 88a, 88b formed on the outside surfaces of the support 40 and the cover housing 70. The lock 80 is slid along the rails until the front end 89 of the slip-on section 85 reaches the restraining wall 87 of the support 40. At that time, the catches 86a engage against a pair of shoulders 63 of the insulating housing 60, and the end surface 86b located between the catches 86a engages with the latch 64 of the insulating housing 60. In other words, the front end of the lock 80 covers both edges of the connecting surface 20a of the insulating housing 60, thus reliably retaining the insulating housing 60 in position.

This completes the process of fabrication of the cable connector assembly 10 requiring eight steps. All above explanations referred to one side of the cable connector assembly 10 and the same or similar steps shall be performed for the other side.

Explanations concerning the preferred embodiment of the cable connector assembly and the method of fabrication thereof according to this invention have been provided; however, this does not limit the invention, and various modifications that can be made by experts in the art shall be covered by the invention.

The cable connector assembly according to this invention provides for electrical connection between conductors of flat cables and multiple electrical contacts by exposing portions of multiple conductors of the flat cables at a location distal from the cable ends across the cable, by connecting the exposed portions to conductive pads on a printed circuit board and by connecting the printed circuit board to multiple electrical contacts arranged in an insulating housing, thus making it possible to obtain reliable electrical connections between the electrical contacts arrayed in the connector and the conductors of the flat cables having relatively narrow pitch of the conductors.

According to the method of fabrication of the cable connector assembly according to this invention, multiple conductors of a flat cable are stripped of the insulating coating away from an end of the cable exposing portions of the conductors after which the flat cable is placed parallel to a printed circuit board to which electrical contacts accommodated in an insulating housing are electrically connected, after which the exposed portions of the conductors are electrically connected to the printed circuit board, and since it is easy to maintain the pitch of multiple conductors exposed this way, it is possible to precisely connect the exposed portions of the conductors to the circuit board. Therefore, it is possible to easily connect narrow pitch flat cables to electrical contacts contained in a connector, that makes this method especially suitable for automotive industry applications and other applications requiring the use of narrow pitch flat cables.

What is claimed is:

1. A cable connector assembly comprising:

an insulating support;

contact sections adapted for electrical connection to contacts of a mating connector;

a circuit board disposed on the insulating support and having conductive pads electrically connected to the contact sections;

a flat electrical cable comprising an array of insulated conductors connected in a common plane and having an end, wherein a portion of each conductor is exposed near the end while the conductors remain insulated and connected in a common plane at the end, the exposed portions of the cable being electrically connected to respective conductive pads on the circuit board thereby electrically interconnecting the cable conductors to the contact sections;

an insulating housing mounted to the insulating support and having cavities in which the contact sections are disposed;

a cover housing mounted to the insulating support and engaging the cable to provide strain relief therefore; and wherein the cable connector assembly is adapted for pluggable engagement with a mating connector such that, when the cable connector assembly and a mating connector are plugged together, contacts of the mating connector are received by the cavities of the insulating housing and are electrically connected to the contact sections disposed therein.

2. A cable connector assembly as claimed in claim 1, wherein the contact sections are not integrated into the circuit board, the cable connector assembly further comprising electrical contacts mounted to the circuit board, a portion of each electrical contact being a contact section.

3. A cable connector assembly as claimed in claim 2, wherein a first and a second connector subassembly are disposed along opposite sides of an insulating divider, the insulating housing is mounted to the insulating support of the first and second connector subassemblies, and the cover housing of the first and second connector subassemblies engages the flat cable thereof.

4. A cable connector assembly as claimed in claim 3, wherein locks engage the insulating support and cover housing of the first and second connector subassemblies thereby locking the first and second connector subassemblies together.

5. A cable connector assembly as claimed in claim 3, wherein the insulating support of the first and second subassemblies and the insulating housing include latching members for latching the insulating housing and the insulating support of the first and second connector subassemblies together.

6. A cable connector assembly as claimed in claim 1 wherein said insulating support includes recesses in which portions of said contacts are disposed, and board-connecting sections of said contacts extend orthogonally from said insulating support and through through-holes of the circuit board to be soldered to circuits thereof.

7. A cable connector assembly comprising:

first and second connector subassemblies disposed along opposite sides of an insulating divider, each said subassembly comprising:

an insulating support;

contact sections adapted for electrical connection to contacts of a mating connector;

a circuit board disposed on the insulating support and having conductive pads electrically connected to the contact sections;

a flat electrical cable comprising an array of insulated conductors connected in a common plane and having an end, wherein a portion of each conductor is exposed near the end while the conductors remain insulated and connected in a common plane at the end, the exposed portions of the cable being electrically connected to respective conductive pads on the circuit board thereby electrically interconnecting the cable conductors to the contact sections;

an insulating housing mounted to the insulating support and having cavities in which the contact sections are disposed;

a cover housing mounted to the insulating support and engaging the cable to provide strain relief therefore; and wherein the cable connector assembly is adapted for pluggable engagement with a mating connector such that, when the cable connector assembly and a mating connector are plugged together, contacts of the mating connector are received by the cavities of the insulating housing and are electrically connected to the contact sections disposed therein.

8. A cable connector assembly as claimed in claim 7, wherein locks engage said insulating support and cover housing of said first and second connector subassemblies thereby locking said first and second connector subassemblies together.

9. A cable connector assembly as claimed in claim 7, wherein said insulating supports of said first and second subassemblies and said insulating housing include latching members for latching said insulating housing and said insulating supports of said first and second connector subassemblies together.

* * * * *